United States Patent
Li et al.

(10) Patent No.: US 9,885,931 B2
(45) Date of Patent: Feb. 6, 2018

(54) SUB-PIXEL UNIT, ARRAY SUBSTRATE AND DISPLAY DEVICE

(71) Applicant: BOE TECHNOLOGY GROUP CO., LTD., Beijing (CN)

(72) Inventors: Yingyi Li, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/120,884

(22) PCT Filed: Feb. 3, 2016

(86) PCT No.: PCT/CN2016/073286
§ 371 (c)(1),
(2) Date: Aug. 23, 2016

(87) PCT Pub. No.: WO2017/041427
PCT Pub. Date: Mar. 16, 2017

(65) Prior Publication Data
US 2017/0068141 A1    Mar. 9, 2017

(30) Foreign Application Priority Data

Sep. 8, 2015 (CN) .................. 2015 2 0691409 U

(51) Int. Cl.
*H01L 27/14* (2006.01)
*G02F 1/1362* (2006.01)
(Continued)

(52) U.S. Cl.
CPC ........ *G02F 1/136286* (2013.01); *G02F 1/137* (2013.01); *G02F 1/134309* (2013.01);
(Continued)

(58) Field of Classification Search
CPC ............ G02F 1/1368; G02F 1/133514; G02F 1/13624; G02F 1/136213; G02F 1/136286;
(Continued)

(56) References Cited

U.S. PATENT DOCUMENTS

2012/0105785 A1* 5/2012 Kim .................. G09G 3/3648
349/139
2012/0162294 A1    6/2012 Choi
(Continued)

FOREIGN PATENT DOCUMENTS

CN    1694152 A    11/2005
CN    10581838 A    11/2009
(Continued)

OTHER PUBLICATIONS

Search Report and Written Opinion dated Apr. 27, 2016 from State Intellectual Property Office of the P.R. China.

*Primary Examiner* — A. Sefer
(74) *Attorney, Agent, or Firm* — Dilworth & Barrese, LLP.; Michael J. Musella, Esq.

(57) ABSTRACT

A sub-pixel unit, an array substrate and a display device are provided. The sub-pixel unit (1) includes a first sub-pixel electrode (10), a second sub-pixel electrode (11) and a common electrode line (12). The common electrode line (12) includes a first common electrode sub-line (120) and a second common electrode sub-line (121); an overlapped area between the first common electrode sub-line (120) and the first sub-pixel electrode (10) is larger than an overlapped area between the second common electrode sub-line (121) and the second sub-pixel electrode (11).

18 Claims, 4 Drawing Sheets

(51) Int. Cl.
*H01L 27/12* (2006.01)
*G02F 1/137* (2006.01)
*G02F 1/1343* (2006.01)

(52) U.S. Cl.
CPC ........ *H01L 27/124* (2013.01); *H01L 27/1255* (2013.01); *G02F 2001/134345* (2013.01)

(58) Field of Classification Search
CPC ............... G02F 1/134309; G02F 1/137; G02F 2001/134345; G02F 2201/123; G02F 2201/121; G02F 2001/01; H01L 27/124; H01L 27/1255; H01L 27/0207; H01L 27/1259
See application file for complete search history.

(56) References Cited

U.S. PATENT DOCUMENTS

| | | | | |
|---|---|---|---|---|
| 2013/0057813 A1* | 3/2013 | Jeong | ................ | G02F 1/134309 349/110 |
| 2013/0215341 A1* | 8/2013 | Rho | ................ | G02F 1/134309 349/15 |
| 2014/0098315 A1* | 4/2014 | Jung | ................ | G02F 1/136209 349/42 |
| 2015/0042914 A1* | 2/2015 | Cho | ................ | G02F 1/136286 349/43 |
| 2015/0212351 A1* | 7/2015 | Han | ................ | G02F 1/133377 349/41 |
| 2016/0131951 A1* | 5/2016 | Lee | ................ | G02F 1/13624 349/39 |
| 2016/0238908 A1* | 8/2016 | Kim | ................ | G02F 1/134336 |
| 2016/0291367 A1* | 10/2016 | Cheng | ................ | G02F 1/1368 |

FOREIGN PATENT DOCUMENTS

| | | | |
|---|---|---|---|
| CN | 204065625 | * | 12/2014 |
| CN | 204925570 U | | 12/2015 |
| KR | 20030065817 A | | 8/2003 |

* cited by examiner

SUB-PIXEL UNIT, ARRAY SUBSTRATE AND DISPLAY DEVICE

TECHNICAL FIELD

Embodiments of present disclosure relate to a sub-pixel unit, an array substrate and a display device.

BACKGROUND

Liquid Crystal Display (LCD) device is such a kind of display device that arrangement of liquid crystal molecules is changed by controlling liquid crystals through a Thin Film Transistor (TFT) so as to achieve a display function. The LCD device is provided with a storage capacitance for electric discharge upon the TFT having been switched off for a predetermined period of time in order to maintain a voltage between a pixel electrode and a common electrode within a certain range, which can optimize display effect of the LCD.

However, since currently utilized common electrodes are strip electrodes with uniform widths, the storage capacitances generated by common electrodes and pixel electrodes in a single sub-pixel unit are identical with each other without a capability of adjusting an electric field distribution within the single sub-pixel unit.

SUMMARY

Embodiments of the present disclosure provide a sub-pixel unit, an array substrate and a display device.

Embodiments of the present disclosure utilize technical solutions as below.

Embodiments of the present disclosure provide a sub-pixel unit, including a first sub-pixel electrode, a second sub-pixel electrode and a common electrode line; wherein the common electrode line includes a first common electrode sub-line and a second common electrode sub-line; an overlapped area between the first common electrode sub-line and the first sub-pixel electrode is larger than an overlapped area between the second common electrode sub-line and the second sub-pixel electrode.

In an example, a ratio of the overlapped area between the first common electrode sub-line and the first sub-pixel electrode and an area of the first sub-pixel electrode is larger than a ratio of the overlapped area between the second common electrode sub-line and the second sub-pixel electrode and an area of the second sub-pixel electrode.

In an example, the first common electrode sub-line and the second common electrode sub-line both have a shape of straight strip, and a width of the first common electrode sub-line is larger than a width of the second common electrode sub-line.

In an example, the width of the first common electrode sub-line is 4 times smaller than that of the second common electrode sub-line.

In an example, the width of the first common electrode sub-line is 2 times of the width of the second common electrode sub-line.

In an example, at least one of the first common electrode sub-line and the second common electrode sub-line is provided with a via hole.

In an example, at least one of the first common electrode sub-line and the second common electrode sub-line has one side being a straight line and the other side provided with a groove.

In an example, the groove has a shape of triangle, tetragonum or arc.

In an example, the groove has a shape of isosceles triangle or isosceles trapezoid.

In an example, at least one of the first common electrode sub-line and the second common electrode sub-line has a curved shape.

In an example, a connecting line of the common electrode line is spatially intersected with a gate line or a data line.

In an example, the gate line or data line has an overlap with the first sub-pixel electrode; or, the gate line or data line has an overlap with the second sub-pixel electrode.

Embodiments of the present disclosure provide an array substrate including a plurality of sub-pixels having any of the above features.

Embodiments of the present disclosure further provide a display device including an array substrate having any of the above features.

BRIEF DESCRIPTION OF THE DRAWINGS

Embodiments of the present disclosure will be described in detail hereunder in conjunction with accompanying drawings to allow one of ordinary skill in the art to understand the present disclosure more clearly, in which.

DETAILED DESCRIPTION

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any inventive work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "the," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

A single pixel unit on an array substrate may include a plurality of sub-pixel units (e.g., red sub-pixel unit, green sub-pixel unit and blue sub-pixel unit). Hereinafter embodiments will be described with reference to the instances where all the sub-pixel units on the array substrate have identical structures as examples and for simplifying the description only, while embodiments of the present disclosure are not limited thereto.

The First Embodiment

Figure 1:
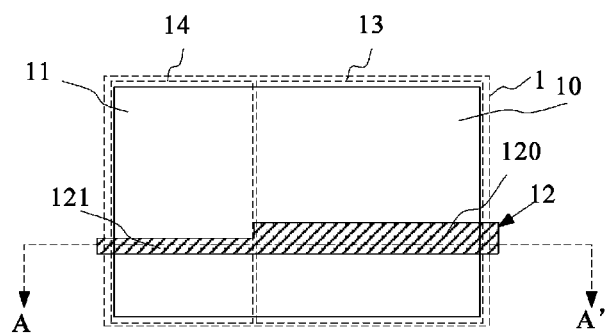
FIG. 1 is a schematically structural view I illustrating a sub-pixel unit provided in an embodiment of the present disclosure.

For example, embodiments of the present disclosure provide a sub-pixel unit 1 defined by gate lines (not shown) and data lines (not shown). A top view of the sub-pixel unit 1 is shown in FIG. 1. The sub-pixel unit 1 includes a first sub-pixel subunit 13, a first sub-pixel electrode 10, a second sub-pixel subunit 14, a second sub-pixel electrode 11, and a common electrode line 12. The sub-pixel unit 1 can further include a thin film transistor (TFT) (not shown) which controls the first sub-pixel electrode 10 and the second sub-pixel electrode 11.

The common electrode line 12 includes a first common electrode sub-line 120 overlapped with the first sub-pixel electrode 10; and a second common electrode sub-line 121 overlapped with the second sub-pixel electrode 11.

An overlapped area between the first common electrode sub-line 120 and the first sub-pixel electrode 10 is larger than an overlapped area between the second common electrode sub-line 121 and the second sub-pixel electrode 11.

Based on a formula for calculating capacitance $C=\in S/4\pi kd$, where $\in$ is a dielectric constant, k is an electrostatic force constant, and given that a distance between the first sub-pixel electrode 10 and the common electrode line 12 is identical with a distance between the second sub-pixel electrode 11 and the common electrode line 12, then a capacitance of the sub-pixel unit is determined by an overlapped area S between respective sub-pixel electrode and the common electrode line. For example, the capacitance of the first sub-pixel subunit 13 is determined by an overlapped area between the first common electrode sub-line 120 and the first sub-pixel electrode 10; and the capacitance of the second sub-pixel subunit 14 is determined by an overlapped area between the second common electrode sub-line 121 and the second sub-pixel electrode 11.

In this way, by forming different overlapped areas between the common electrode line and the sub-pixel electrode arranged within the sub-pixel unit to generate different storage capacitances, electric field distribution in a single sub-pixel unit can be adjusted so as to optimize the display effect.

It is noted that the sub-pixel unit 1 can be divided into any number of sub-pixel electrodes. Optionally, each of the sub-pixel electrodes has an overlap with the common electrode line.

The Second Embodiment

Figure 2:
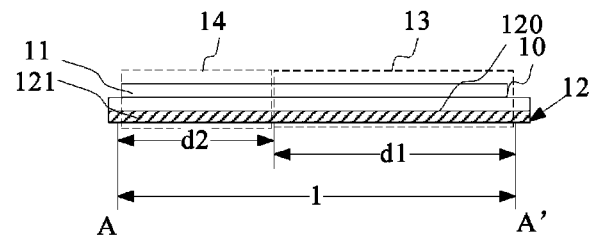
FIG. 2 is a schematically structural view II illustrating a sub-pixel unit provided in an embodiment of the present disclosure.

As shown in FIG. 2 in conjunction with FIG. 1, a ratio of the overlapped area between the first common electrode sub-line 120 and the first sub-pixel electrode 10 and an area of the first sub-pixel electrode 10 is larger than a ratio of the overlapped area between the second common electrode sub-line 121 and the second sub-pixel electrode 11 and an area of the second sub-pixel electrode 11.

A ratio of the overlapped area between the first common electrode sub-line 120 and the first sub-pixel electrode 10 and an area of the first sub-pixel electrode 10 is larger than a ratio of the overlapped area between the second common electrode sub-line 121 and the second sub-pixel electrode 11 and an area of the second sub-pixel electrode 11, which explains that a quantity of electric charges stored in a unit area of the first sub-pixel electrode 10 is larger than a quantity of electric charges stored in a unit area of the second sub-pixel electrode 11 such that a difference between storage capacitances corresponding to different sub-pixel electrodes in a single sub-pixel unit is more stable, thereby optimizing the display effect in a better way.

The Third Embodiment

For better description of the first and second embodiment, the present embodiment is described with reference to the overlapped area between the common electrode line and respective sub-pixel electrode in a unit length by way of example. As shown in FIG. 2 in conjunction with FIG. 1, the common electrode line has a shape of straight strip. An overlapped area between the first common electrode sub-line 120 and the first sub-pixel electrode 10 in a unit length is larger than an overlapped area between the second common electrode sub-line 121 and the second sub-pixel electrode 11 in a unit length. The term "unit length" as used in the present disclosure refers to a reference standard rather than a constant value and is variable depending on settings; that is, it is not an actual unit of measurement for length. The so-called overlapped area between the first common electrode sub-line 120 and the first sub-pixel electrode 10 in a unit length refers to a ratio of the overlapped area between the first common electrode sub-line 120 and the first sub-pixel electrode 10 and a straight line length of the first common electrode sub-line 120. A sectional view of the sub-pixel unit 1 along A-A' of FIG. 1 is shown in FIG. 2 (an insulating layer is disposed between the first sub-pixel electrode 10 and the common electrode line 12 without reference numeral). Herein, the straight line length of the first common electrode sub-line 120 refers to a length of a straight line connecting both ends of the first common electrode sub-line 120, as indicated by d1 in FIG. 2. Likewise, the so-called overlapped area between the second common electrode sub-line 121 and the second sub-pixel electrode 11 in a unit length refers to a ratio of the overlapped area between the second common electrode sub-line 121 and the second sub-pixel electrode 11 and a straight line length of the second common electrode sub-line 121. Herein, the straight line length of the second common electrode sub-line 121 refers to a length of a straight line connecting both ends of the second common electrode sub-line 121, as indicated by d2 in FIG. 2.

Optionally, the first common electrode sub-line 120 and the second common electrode sub-line 121 both have a shape of straight strip, and a width of the first common electrode sub-line 120 is larger than a width of the second common electrode sub-line 121.

During a manufacture process of the display device, in order to allow a transmittance of the display device in a better way, a width of the common electrode line 12 is no larger than 3 µm; correspondingly, the width of the second common electrode sub-line 121 is no larger than the width of the first common electrode sub-line 120, and the width of the first common electrode sub-line 120 is no larger than 3 µm.

For example, the width of the first common electrode sub-line 120 is 4 times smaller than that of the second common electrode sub-line 121.

For example, the width of the first common electrode sub-line 120 is 2 times of the width of the second common electrode sub-line 121.

Figure 3:
FIG. 3 is a schematically structural view I illustrating a common electrode in a sub-pixel unit provided in an embodiment of the present disclosure.

It is noted that, in the embodiments of the present disclosure, the common electrode line 12 is divided into the first common electrode sub-line 120 and the second common electrode sub-line 121 for convenience of illustration of different portions of the common electrode line 12. The portions of the common electrode 12 distributed in the sub-pixel unit corresponding to respective sub-pixel electrodes can be electrically connected; or can be formed into an integral pattern in the sub-pixel pixel, as shown in FIG. 3.

Figure 4:
FIG. 4 is a schematically structural view II illustrating a common electrode in a sub-pixel unit provided in an embodiment of the present disclosure.

It is noted that, the term "a shape of straight strip" as mentioned in the embodiments of the present disclosure refers to a shape of common electrode line having a length larger than a width with two long sides thereof being parallel with each other without any limitation to short sides thereof. Moreover, for example, the term "a shape of straight strip" as mentioned in the present disclosure cannot only be a rectangular shown in FIG. 1 but can also be the case illustrated in FIG. 4 where a top end of the first common electrode sub-line 120 has a projected tip (indicated by dashed box in the figure) such that the short sides thereof have irregular shapes resulted from bending lines, which meets the condition of a length larger than a width; however, embodiments of the present disclosure are not limited thereto.

The Fourth Embodiment

The shape of the common electrode line is not limited to straight strip but can also be various other forms. The first common electrode sub-line 120 and the second common electrode sub-line 121 can have identical structures or different structures.

Figure 5:
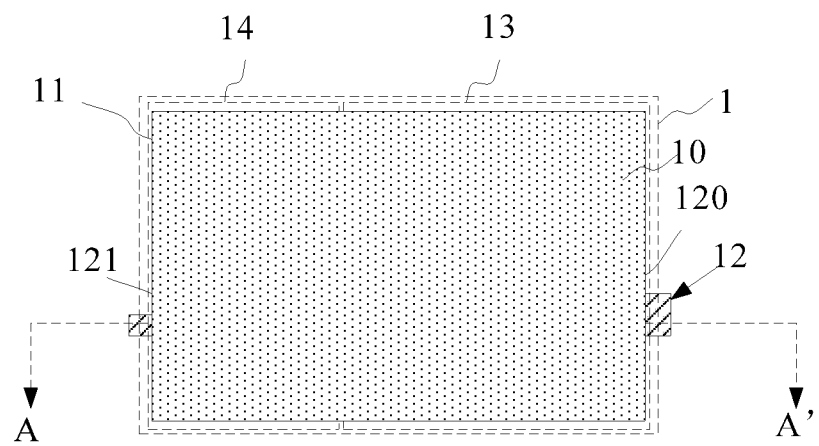
FIG. 5 is a schematically structural view III illustrating a sub-pixel unit provided in an embodiment of the present disclosure.

For example, at least one of the first common electrode sub-line 120 and the second common electrode sub-line 121 has a via hole, as shown in FIG. 5.

Figure 6:
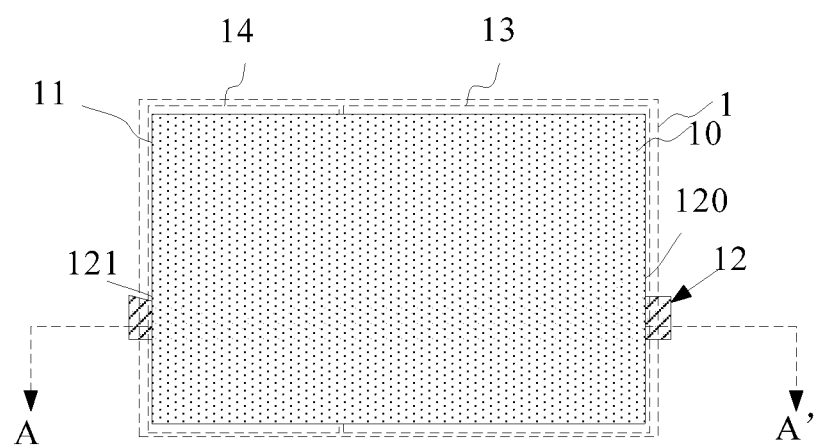
FIG. 6 is a schematically structural view IV illustrating a sub-pixel unit provided in an embodiment of the present disclosure.

For example, at least one of the first common electrode sub-line 120 and the second common electrode sub-line 121 has one side of a straight line and the other side provided with a groove, as shown in FIG. 6.

Optionally, the groove can have a shape of a regular pattern, or an irregular pattern. For example, the regular pattern includes triangle, regular polygon, circular and the like; the irregular pattern includes a pattern constituted by a plurality of arc-like lines.

Optionally, the groove has a shape of triangle, tetragonum, or an arc-like shape.

Figure 7:
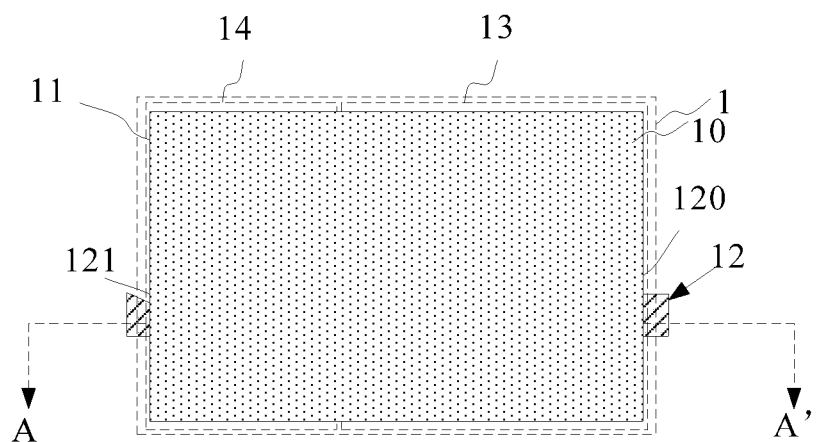
FIG. 7 is a schematically structural view V illustrating a sub-pixel unit provided in an embodiment of the present disclosure.
Figure 8:
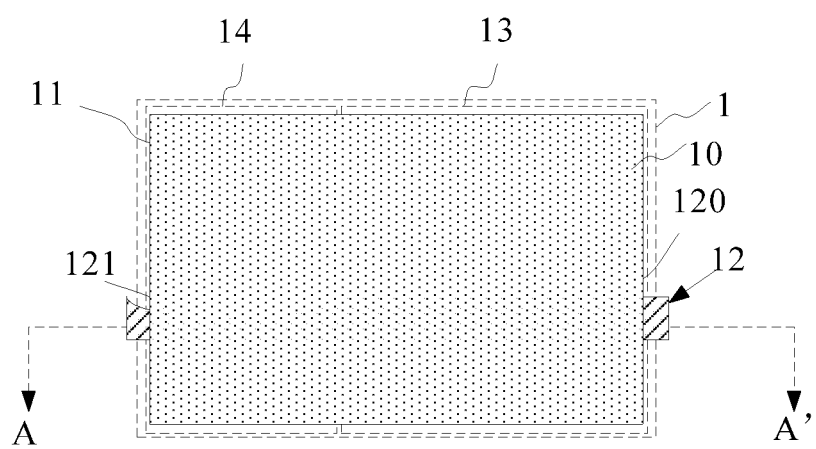
FIG. 8 is a schematically structural view VI illustrating a sub-pixel unit provided in an embodiment of the present disclosure.

For example, the groove has a shape of isosceles triangle (as shown in FIG. 6), isosceles trapezoid (as shown in FIG. 7), or an arc-like shape (as shown in FIG. 8).

Figure 9:
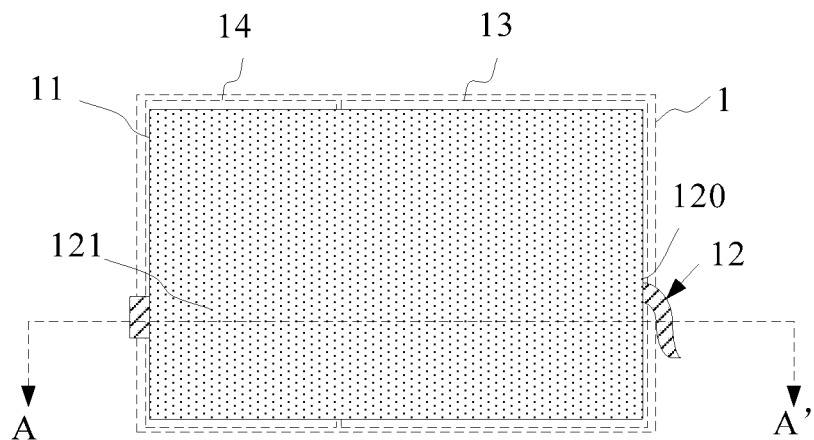
FIG. 9 is a schematically structural view VII illustrating a sub-pixel unit provided in an embodiment of the present disclosure.
Figure 10:
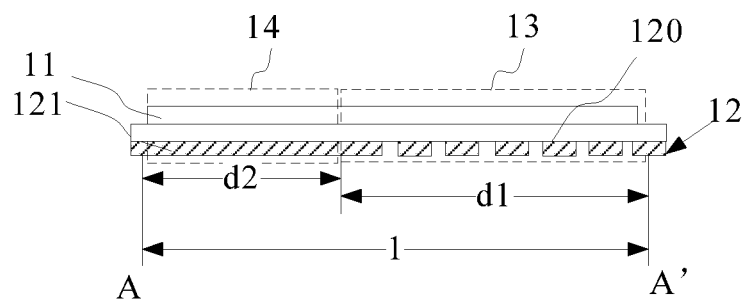
FIG. 10 is a schematically structural view VIII illustrating a sub-pixel unit provided in an embodiment of the present disclosure.

For example, at least one of the first common electrode sub-line and the second common electrode sub-line has a curved shape. For example, as shown in FIG. 9, in which the first common electrode sub-line 120 has a curved shape while the second common electrode sub-line 121 has a shape of straight strip, it is understood that, if the first common electrode sub-line 120 has a curved shape, then the second common electrode sub-line 121 has a shape of straight strip. A sectional view of the sub-pixel unit 1 along A-A' of FIG. 9 is as shown in FIG. 10, in which a cross-section of the first common electrode sub-line 120 is discontinuous.

It is noted that, during practical manufacture process, in order to simplify the process and permit good product yield, the first common electrode sub-line 120 and the second common electrode sub-line 121 both can have a straight strip structure (as shown in FIG. 1). Likewise, it is understood that, practical patterning processes cannot ensure both of the first common electrode sub-line 120 and the second common electrode sub-line 121 having an absolutely regular straight strip structure as shown in FIG. 1.

The Fifth Embodiment

Figure 11:
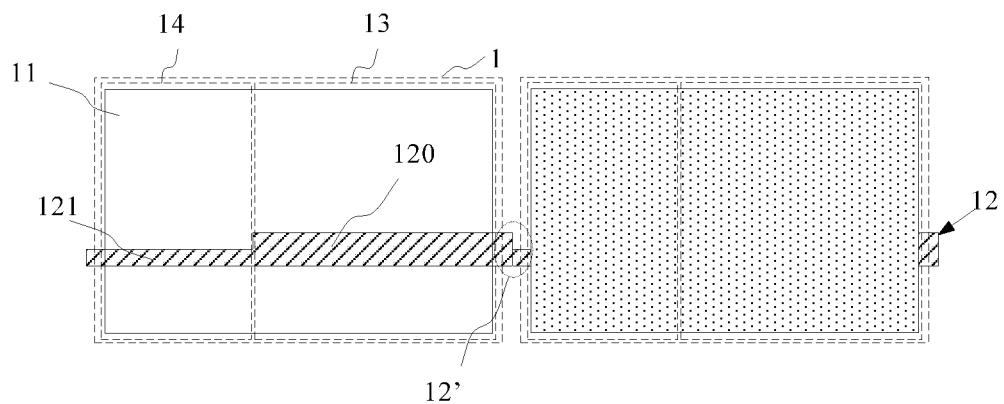
FIG. 11 is a schematically structural view IX illustrating a sub-pixel unit provided in an embodiment of the present disclosure.

In the present embodiment, as shown in FIG. 11 which is a top view illustrating adjacent sub-pixel units on an array substrate, the common electrode lines 12 of adjacent sub-pixel units are electrically connected through a connecting line 12' (indicated by a dashed circle in the figure). The common electrode lines 12 and the connecting line 12' thereof can extend along a direction of gate lines or data lines.

For example, the connecting line 12' of the common electrode lines 12 and the gate line (not shown) for driving the pixel unit are intersected spatially (FIG. 11).

For example, the connecting line 12' of the common electrode lines 12 and the gate line (not shown) for driving the pixel unit are not located at a same layer during the manufacture process with at least one insulating layer (not shown) being disposed there-between.

The connecting line 12' of the common electrode lines 12 can also be spatially intersected with the data line for driving the pixel unit.

Optionally, given that the common electrode 12 has a shape of line, then the common electrode lines 12 and the connecting line 12' thereof are parallel with the data line (not shown) for driving the pixel unit; given that the common electrode 12 has a curved shape, then the common electrode lines 12 and the connecting line 12' thereof are parallel with the data line (not shown) for driving the pixel unit along a direction indicated by A-A' in FIG. 9.

For example, the gate line or the data line has an overlap with the first sub-pixel electrode; or, the gate line or the data line has an overlap with the second sub-pixel electrode.

It is noted that the drawings provided by the embodiments of the present disclosure all illustrate cases where respective sub-pixel electrodes fully cover the common electrode line 12; however, in practical application, the respective sub-pixel electrodes can partially cover the common electrode line 12. Embodiments of the present disclosure are not limited to thereto.

The embodiments of the present disclosure provide a way in which the sub-pixel unit is divided into a first sub-pixel electrode and a second sub-pixel electrode. Theoretically, in order to adjust electric field distribution in a single sub-pixel unit more accurately so as to optimize the display effect, it is also possible to divide the sub-pixel unit into three or more sub-pixel electrodes or sub-pixel subunits. The exemplary solution of the embodiments of the present disclosure is provided from a view of manufacture process, but other solutions of dividing the sub-pixel unit into three or more sub-pixel electrodes or sub-pixel subunits also fall in the scope of the present disclosure.

The solution provided by the embodiments of the present disclosure modifies the common electrode line so that the overlapped area between the first common electrode sub-line and the first sub-pixel electrode is larger than the overlapped area between the second common electrode sub-line and the second sub-pixel electrode; based on similar reasons, by modifying the pixel electrode in the above-mentioned manner can also achieve objectives of forming two different storage capacitances in a single sub-pixel unit, adjusting the electric field distribution in a single sub-pixel unit and optimizing the display effect; accordingly, such or similar embodiments and variations thereof also fall in the scope of the present disclosure.

The Six Embodiment

Embodiments of the present disclosure also provide an array substrate, including a plurality of sub-pixel units having any of the above-mentioned features. Each of the sub-pixel units includes a first sub-pixel electrode, a second sub-pixel electrode and a common electrode line. The common electrode line includes a first common electrode sub-line and a second common electrode sub-line.

An overlapped area between the first common electrode sub-line and the first sub-pixel electrode is larger than an overlapped area between the second common electrode sub-line and the second sub-pixel electrode.

The design allows constituting two different storage capacitances in a single sub-pixel unit, which can adjust the electric field distribution in the sub-pixel unit and optimize the display effect.

Optionally, the sub-pixel electrodes can be electrically connected to at least one TFT, respectively.

Optionally, at least two TFTs in the sub-pixel unit are electrically connected to a same data line and are driven by a same gate line.

The Seventh Embodiment

Embodiments of the present disclosure also provide a display device, including an array substrate having any of the above-mentioned features.

Embodiments of the present disclosure provide a sub-pixel unit, an array substrate and a display device, the sub-pixel unit includes a first sub-pixel electrode, a second sub-pixel electrode and a common electrode line; wherein the common electrode line includes a first common electrode sub-line and a second common electrode sub-line. An overlapped area between the first common electrode sub-line and the first sub-pixel electrode is larger than an overlapped area between the second common electrode sub-line and the second sub-pixel electrode. By forming different overlapped areas between the common electrode line and the sub-pixel electrodes in a single sub-pixel unit to generate different storage capacitances, the electric field distribution in the sub-pixel unit is adjusted and the display effect is optimized.

The foregoing are merely exemplary embodiments of the disclosure, but, the embodiments of the present disclosure are not limited thereto. Any alternations and improvements without departing from the spirit and principle of the present disclosure shall fall within the scope of the present disclosure. The scope of the present disclosure shall be defined by the claims.

The present application claims the benefits of Chinese patent application No. 201520691409.2 filed on Sep. 8, 2015 and entitled "A Sub-pixel Unit, An Array Substrate and A Display Device", the contents of which are incorporated herein by reference entirely.

What is claimed is:

1. A sub-pixel unit, comprising a first sub-pixel electrode, a second sub-pixel electrode and a common electrode line; wherein
    the common electrode line comprises a first common electrode sub-line and a second common electrode sub-line;
    an overlapped area between the first common electrode sub-line and the first sub-pixel electrode is larger than an overlapped area between the second common electrode sub-line and the second sub-pixel electrode; and
    a width of the first common electrode sub-line is greater than a width of the second common electrode sub-line.

2. The sub-pixel unit according to claim 1, wherein a ratio of the overlapped area between the first common electrode sub-line and the first sub-pixel electrode and an area of the first sub-pixel electrode is larger than a ratio of the overlapped area between the second common electrode sub-line and the second sub-pixel electrode and an area of the second sub-pixel electrode.

3. The sub-pixel unit according to claim 2, wherein at least one of the first common electrode sub-line and the second common electrode sub-line has a via hole.

4. The sub-pixel unit according to claim 2, wherein at least one of the first common electrode sub-line and the second common electrode sub-line has one side being a straight line and the other side has a groove.

5. The sub-pixel unit according to claim 2, wherein at least one of the first common electrode sub-line and the second common electrode sub-line has a curved shape.

6. The sub-pixel unit according to claim 2, wherein a connecting line of common electrode lines is spatially intersected with a gate line or a data line.

7. The sub-pixel unit according to claim 1, wherein the first common electrode sub-line and the second common electrode sub-line both have a shape of straight strip.

8. The sub-pixel unit according to claim 7, wherein the width of the first common electrode sub-line is less than 4 times the width of the second common electrode sub-line.

9. The sub-pixel unit according to claim 8, wherein the width of the first common electrode sub-line is 2 times of the width of the second common electrode sub-line.

10. The sub-pixel unit according to claim 7, wherein the width of the first common electrode sub-line is 2 times of the width of the second common electrode sub-line.

11. The sub-pixel unit according to claim 1, wherein at least one of the first common electrode sub-line and the second common electrode sub-line has a via hole.

12. The sub-pixel unit according to claim 1, wherein at least one of the first common electrode sub-line and the second common electrode sub-line has a curved shape.

13. The sub-pixel unit according to claim 1, wherein a connecting line of common electrode lines is spatially intersected with a gate line or a data line.

14. The sub-pixel unit according to claim 1, wherein a gate line or a data line has an overlap with the first sub-pixel electrode; or, a gate line or a data line has an overlap with the second sub-pixel electrode.

15. An array substrate, comprising a plurality of sub-pixel units according to claim 1.

16. A display device, comprising the array substrate according to claim 15.

17. A sub-pixel unit, comprising:
- a first sub-pixel electrode, a second sub-pixel electrode and a common electrode line;
- wherein the common electrode line comprises a first common electrode sub-line and a second common electrode sub-line;
- an overlapped area between the first common electrode sub-line and the first sub-pixel electrode is larger than an overlapped area between the second common electrode sub-line and the second sub-pixel electrode; and
- at least one of the first common electrode sub-line and the second common electrode sub-line has one side being a straight line and the other side has a groove.

18. The sub-pixel unit according to claim 17, wherein the groove has a shape of triangle, tetragonum or arc.

* * * * *